United States Patent
Liu et al.

(10) Patent No.: US 11,897,240 B2
(45) Date of Patent: Feb. 13, 2024

(54) LAMINATING DEVICE AND LAMINATING METHOD

(71) Applicants: Chengdu BOE Optoelectronics Technology Co., Ltd., Chengdu (CN); BOE TECHNOLOGY GROUP CO., LTD., Beijing (CN)

(72) Inventors: Shaokui Liu, Beijing (CN); Wei Qing, Beijing (CN); Wenwei Mo, Beijing (CN); Qiang Tang, Beijing (CN); Xingguo Liu, Beijing (CN); Huiqiang Song, Beijing (CN); Ren Xiong, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/636,095

(22) PCT Filed: Apr. 9, 2021

(86) PCT No.: PCT/CN2021/086268
§ 371 (c)(1),
(2) Date: Feb. 17, 2022

(87) PCT Pub. No.: WO2021/232996
PCT Pub. Date: Nov. 25, 2021

(65) Prior Publication Data
US 2022/0288909 A1  Sep. 15, 2022

(30) Foreign Application Priority Data
May 18, 2020 (CN) .......................... 202010419387.X

(51) Int. Cl.
*B32B 37/00* (2006.01)
*B32B 37/12* (2006.01)
*H10K 102/00* (2023.01)

(52) U.S. Cl.
CPC ........ *B32B 37/0046* (2013.01); *B32B 37/003* (2013.01); *B32B 37/12* (2013.01);
(Continued)

(58) Field of Classification Search
CPC ........ H10K 2102/311; Y10T 156/1028; B32B 37/0046; B32B 37/003; B32B 38/1866; B32B 2457/206
See application file for complete search history.

(56) References Cited

U.S. PATENT DOCUMENTS

| 10,559,489 | B2 * | 2/2020 | Son ........................ G02F 1/1303 |
| 2014/0345791 | A1 * | 11/2014 | Son ......................... B32B 38/18 156/581 |
| 2019/0315111 | A1 | 10/2019 | Chen et al. |

FOREIGN PATENT DOCUMENTS

| CN | 108615466 A | 10/2018 |
| CN | 108615467 A | 10/2018 |

(Continued)

OTHER PUBLICATIONS

International Search Report and Written Opinion for International Application No. PCT/CN2021/086268 dated Jul. 15, 2021.
(Continued)

*Primary Examiner* — Carson Gross
(74) *Attorney, Agent, or Firm* — Perilla Knox & Hildebrandt LLP; Kenneth A. Knox

(57) ABSTRACT

A laminating device and a laminating method are disclosed. The laminating device is used for laminating a flexible panel together with a curved cover plate. The curved cover plate is provided with a central area and an edge bending area
(Continued)

located in a first direction in the central area. The laminating device comprises a movable mechanism, which is arranged opposite the curved cover plate in a second direction and comprises: a first movable base table and a second movable base table, which are arranged opposite each other in the first direction; and an elastic supporting member, which is provided with an elastic supporting portion, the elastic supporting portion covering parts of the first movable base table station and the second movable base table station that are close to the curved cover plate, and being used for fixing the flexible panel.

17 Claims, 10 Drawing Sheets

(52) U.S. Cl.
CPC . *B32B 2037/1253* (2013.01); *B32B 2457/206* (2013.01); *H10K 2102/311* (2023.02)

(56) References Cited

FOREIGN PATENT DOCUMENTS

| | | | | |
|---|---|---|---|---|
| CN | 108615468 | A | 10/2018 | |
| CN | 108847139 | A | 11/2018 | |
| CN | 109677091 | A | 4/2019 | |
| CN | 208737804 | U | 4/2019 | |
| CN | 110930882 | A | 3/2020 | |
| CN | 111697165 | A | 9/2020 | |
| CN | 111862795 | A * | 10/2020 | ............. G09F 9/301 |
| EP | 3693951 | A1 | 8/2020 | |
| JP | 2019077180 | A | 5/2019 | |
| WO | 2020037785 | A1 | 2/2020 | |

OTHER PUBLICATIONS

First Office Action for CN Patent Application No. 202010419387.X dated Mar. 25, 2023.

* cited by examiner

US 11,897,240 B2

LAMINATING DEVICE AND LAMINATING METHOD

CROSS-REFERENCE TO RELATED APPLICATION

The present disclosure is a national phase application under 35 U.S.C. § 371 of International Application No. PCT/CN2021/086268 filed Apr. 9, 2021, which claims the benefit of and priority to Chinese Patent Application No. 202010419387.X, entitled "Laminating device and laminating method," filed on May 18, 2020, the contents of both of which are hereby incorporated by reference in their entireties herein.

TECHNICAL FIELD

The present disclosure relates to the field of display technology and, in particular, to a laminating device and a laminating method.

BACKGROUND

At present, OLED (Organic Light Emitting Display) displays have been widely used in various electronic products. With the development of curved screens, cover plates with large bending curvature have become a new trend. This puts forward higher requirements for the full lamination method of the curved cover plate and a flexible panel.

SUMMARY

The purpose of the present disclosure is to provide a laminating device and a laminating method.

A first aspect of the present disclosure provides a laminating device, for laminating a flexible panel and a curved cover plate, wherein the curved cover plate has a central area and an edge bending area located in a first direction of the central area, the laminating device includes a movable mechanism, the movable mechanism is arranged opposite the curved cover plate in a second direction and includes:
  a first movable base table;
  a second movable base table, arranged opposite the first movable base table in the first direction;
  an elastic supporting member, having an elastic supporting portion, wherein the elastic supporting portion covers on parts of the first movable base table and the second movable base table that are close to the curved cover plate, and is used for fixing the flexible panel,
  wherein the movable mechanism is able to move in a direction close to the curved cover plate, such that the flexible panel is laminated to the central area;
  the first movable base table and the second movable base table are able to move in the first direction in directions away from each other, such that the flexible panel is laminated to the edge bending area.

In an exemplary embodiment of the present disclosure, the movable mechanism further includes:
  a first fixing slide rail, wherein the first movable base table is slidably mounted on the first fixing slide rail, and the first movable base table slides relative to the first fixing slide rail in the first direction;
  a second fixing slide rail, wherein the second movable base table is slidably mounted on the second fixing slide rail, and the second movable base table slides relative to the second fixing slide rail in the first direction;
  a movable base, having a first pushing inclined surface cooperated with the first movable base table and a second pushing inclined surface cooperated with the second movable base table;
  a first driving member, connected with the movable base, and configured to drive the movable base to move in a direction close to or away from the central area of the curved cover plate;
  wherein, when the first driving member drives the movable base to move in a direction close to the central area of the curved cover plate, the first pushing inclined surface and the second pushing inclined surface respectively push the first movable base table and the second movable base table to move in the first direction in directions away from each other.

In an exemplary embodiment of the present disclosure, a reset elastic member is further provided in the first movable base table and the second movable base table, wherein,
  when the first driving member drives the movable base to move in a direction close to the central area of the curved cover plate, the first movable base table and the second movable base table move in the first direction in directions away from each other, and the reset elastic member is elastically deformed;
  when the first driving member drives the movable base to move in a direction away from the central area of the curved cover plate, the reset elastic member restores elastic deformation, to drive the first movable base table and the second movable base table to move in the first direction in directions close to each other.

In an exemplary embodiment of the present disclosure, the movable mechanism further includes:
  a second driving member, connected to the first movable base table, and configured to drive the first movable base table to move in the first direction in directions close to or away from the second movable base table;
  a third driving member, connected to the second movable base table, and configured to drive the second movable base table to move in the first direction in directions close to or away from the first movable base table.

In an exemplary embodiment of the present disclosure, the first movable base table and the second movable base table include a supporting table covered with the elastic supporting portion and a fixing table located on the supporting table away from the elastic supporting portion, surfaces of the supporting table of the first movable base table and the supporting table of the second movable base table facing each other are provided with a sawtooth structure and engage with each other;
  the elastic supporting member further includes a fixing portion extending from two ends of the elastic supporting portion to a direction close to the fixing table, the fixing portion is connected with the fixing table, such that the elastic supporting member is fixed on the first movable base table and the second movable base table.

In an exemplary embodiment of the present disclosure, the sawtooth structure is formed by splicing a plurality of tooth parts in sequence, and shapes of the plurality of tooth parts are at least one of a rectangle and a circular arc.

In an exemplary embodiment of the present disclosure, the fixing portion has a first extending section and a second extending section,
  one end of the first extending section is connected with the second extending section, and the other end of the first extending section is inclined in a direction away from a center of the elastic supporting portion and is connected with the end of the elastic supporting portion;

the second extending section is provided with a fixing hole, and the fixing hole is used for one end of a locking piece to pass through and connected with the fixing table.

In an exemplary embodiment of the present disclosure, the laminating device further includes:

a carrier film, including a laminating portion for laminating with the flexible panel and connecting portions located at opposite two sides of the laminating portion in the first direction, the laminating portion being supported on the elastic supporting portion;

a clamping adjustment mechanism, connected with the connecting portion and able to apply a clamping force to the connecting portion, such that the laminating portion is laminated to the elastic supporting portion;

wherein, when the first movable base table and the second movable base table move in the first direction in directions away from each other, the clamping adjustment mechanism is able to reduce the clamping force applied to the connecting portion.

In an exemplary embodiment of the present disclosure, an adhesive layer for adhering to the flexible panel is provided on the laminating portion.

In an exemplary embodiment of the present disclosure, the central area of the curved cover plate is a flat area; the elastic supporting portion has a flat portion and edge bending portions located at opposite two sides of the flat portion in the first direction, wherein, the flat portion is used for applying a pressure to the flexible panel, such that the flexible panel is laminated with the central area of the curved cover plate;

the edge bending portion is used for applying a pressure to the flexible panel, such that the flexible panel is laminated to the edge bending area of the curved cover plate.

In an exemplary embodiment of the present disclosure, the elastic supporting member is a silicone member.

A second aspect of the present disclosure provides a laminating method, for laminating a flexible panel and a curved cover plate, wherein the curved cover plate has a central area and an edge bending area located in a first direction of the central area, wherein the laminating method adopts any one of the above laminating devices and includes:

fixing the curved cover plate;

arranging the movable mechanism opposite to the curved cover plate;

fixing the flexible panel on the elastic supporting portion;

driving the movable mechanism to move in a direction close to the curved cover plate, such that the flexible panel is laminated with the central area;

after the flexible panel is laminated with the central area, driving the first movable base table and the second movable base table to move in the first direction in directions away from each other, such that the flexible panel is laminated with the edge bending area.

In an exemplary embodiment of the present disclosure, wherein, when applied to any one of the above laminating devices, in the laminating method, when the first movable base table and the second movable base table are driven to move in the first direction in directions away from each other, a clamping force applied on the connecting portion is reduced by the clamping adjustment mechanism.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification. The drawings in the following description are only some embodiments of the present disclosure. For those of ordinary skill in the art, other drawings can be obtained based on these drawings without creative work.

DETAILED DESCRIPTION

Figure 1:
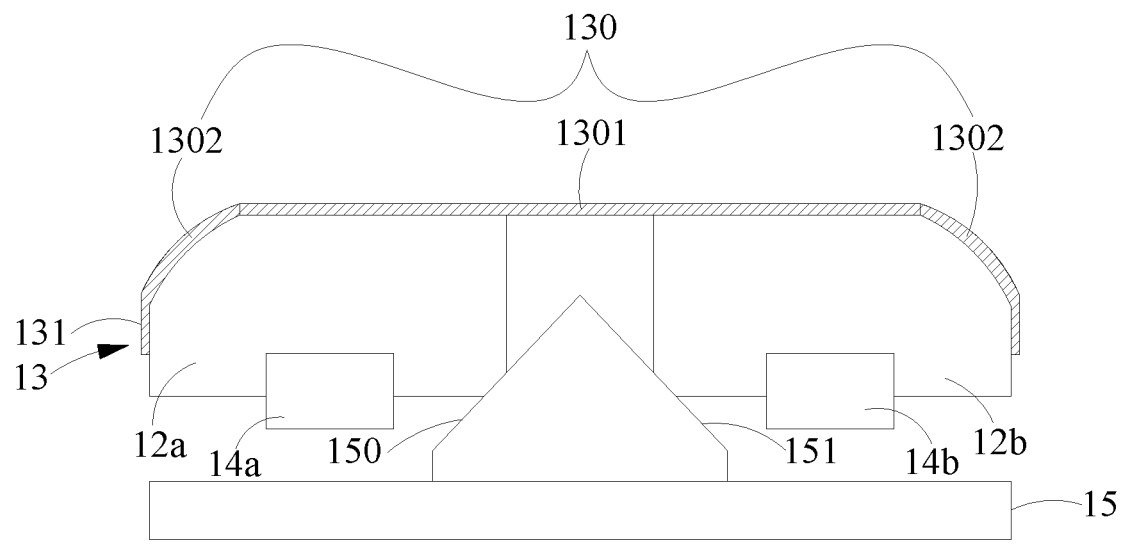
FIG. 1 shows a schematic plan view of a laminating device according to an embodiment of the present disclosure.

In the following, the technical solutions of the present disclosure will be further described in detail through the embodiments and in conjunction with the accompanying drawings. In the specification, the same or similar reference numerals indicate the same or similar parts. The following description of the embodiments of the present disclosure with reference to the accompanying drawings is intended to explain the general inventive concept of the present disclosure, and should not be construed as a limitation to the present disclosure.

In addition, in the following detailed description, for the convenience of explanation, many specific details are set forth to provide a comprehensive understanding of the embodiments of the present disclosure. However, it is apparent that one or more embodiments can also be implemented without these specific details.

It should be noted that the "on . . . ", "formed on . . . ", and "disposed on . . . " in this disclosure can mean that one layer is directly formed or disposed on another layer, or it can also mean that a layer is indirectly formed or disposed on another layer, that is, there are other layers between the two layers.

The terms "a", "an", "the", "said", and "at least one" are used to indicate the presence of one or more elements/components/etc.; the terms "including" and "having" are used to indicate open-ended inclusive meaning and means that there may be additional elements/components/etc. in addition to the listed elements/components/etc.

It should be noted that although the terms "first", "second", etc. may be used herein to describe various parts, components, elements, regions, layers and/or sections, these parts, components, elements, regions, and layers and/or sections should not be limited by these terms. Rather, these terms are used to distinguish one part, component, element, region, layer, and/or section from another part, component, element, region, layer, and/or section.

In the related art, when a flexible panel is laminated to a curved cover plate, schemes such as vacuum pumping, rollers, and airbags are generally used, but the above three schemes are only suitable for the lamination of a small curvature cover plate, and it cannot guarantee a laminating pressure of a bending area when the large curvature cover plate is laminated. Additionally, it is liable to generating air bubbles and other undesirable problems, which cannot meet modern laminating requirements.

To this end, an embodiment of the present disclosure provides a laminating device, which is not only suitable for laminating a flexible panel to a small curvature curved cover plate, but also suitable for laminating a flexible panel to a large curvature curved cover plate.

The laminating device of this embodiment will be described in detail below with reference to the accompanying drawings.

Figure 2:
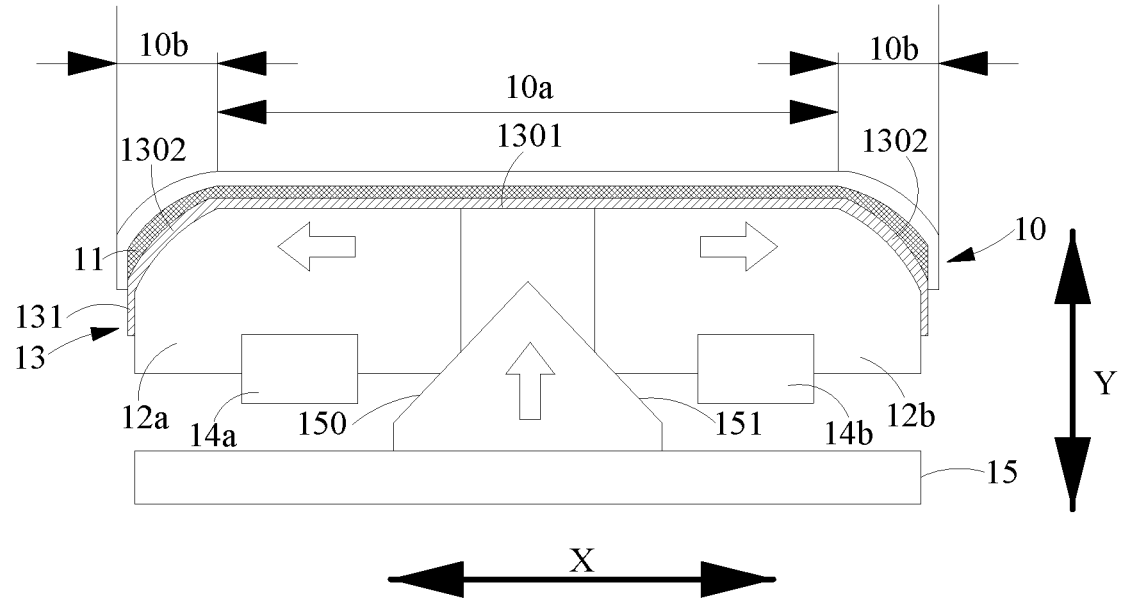
FIG. 2 shows a schematic diagram of a process in which the laminating device described in FIG. 1 is used for laminating a flexible panel and a curved cover plate.
Figure 5:
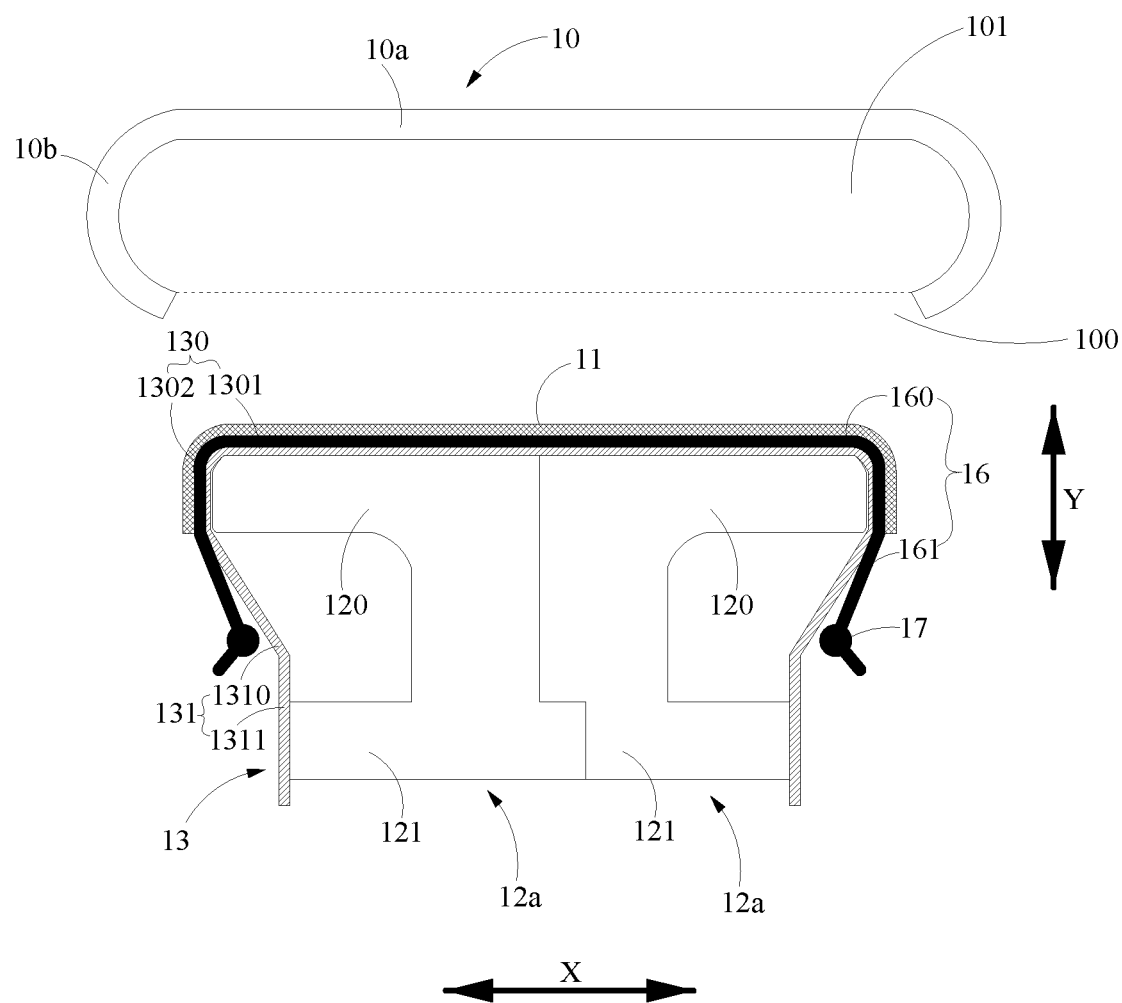
FIG. 5 is a schematic diagram showing the assembling relationship between the laminating device described in FIG. 4 and the flexible panel and the positional relationship between the laminating device described in FIG. 4 and the curved cover plate.

As shown in FIGS. 2 and 5, the curved cover plate 10 has a central area 10a and an edge bending area 10b located in the first direction X of the central area 10a; in the embodiment of the present disclosure, two edge bending areas 10b are provided, which are located on opposite two sides of the central area 10a in the first direction X, respectively. The laminating device may include a movable mechanism, and the movable mechanism can be arranged opposite to the curved cover plate 10 in a second direction, and the second direction and the first direction X can be arranged at an angle according to process requirements; in the embodiments of the present disclosure, the second direction can be perpendicular to the first direction X, for example, the second direction can be the thickness direction Y of the central area 10a of the curved cover plate 10, as shown in FIGS. 2 and 5, but not limited to this, the second direction may also be a direction perpendicular to both the thickness direction Y and the first direction X at the same time.

Specifically, as shown in FIGS. 1 to 5, the movable mechanism may include a first movable base table 12a, a second movable base table 12b and an elastic supporting member 13; the second movable base table 12b is arranged opposite the first movable base table 12a in the first direction X; the elastic supporting member 13 has an elastic supporting portion 130, the elastic supporting portion 130 covers on parts of the first movable base table 12a and the second movable base table 12b that are close to the curved cover plate 10, and is used for fixing the flexible panel 11. It should be understood that, in order to make the flexible panel 11 on the elastic supporting portion 130 able to completely laminate with the curved cover plate 10, the shape of the elastic supporting portion 130 can be matched with the shape of the curved cover plate 10.

For example, as shown in FIGS. 2 and 5, the central area 10a of the curved cover plate 10 may be a flat area; and as shown in FIGS. 1 to 5, the elastic supporting portion 130 has a flat portion 1301 and edge bending portions 1302 located at opposite two sides of the flat portion 1301 in the first direction X, wherein, the flat portion 1301 is used for applying a pressure to the flexible panel 11, such that the flexible panel 11 is laminated with the central area 10a of the curved cover plate 10; the edge bending portion 1302 is used for applying a pressure to the flexible panel 11, such that the flexible panel 11 is laminated to the edge bending area 10b of the curved cover plate 10. It should be noted that the central area 10a of the curved cover plate 10 can not only be set as a flat area, but also can be set as an arc-shaped area. When the central area 10a of the curved cover plate 10 is set as an arc-shaped area, the part of the elastic supporting portion 130 that cooperates with the curved cover plate 10 can be set as an arc-shaped portion, and the distance between the arc-shaped portion and the corresponding positions in the arc-shaped area of the curved cover plate 10 should be equal, to ensure that the arc-shaped portion is closely laminated with the arc-shaped area of the curved cover plate 10.

Figure 9:
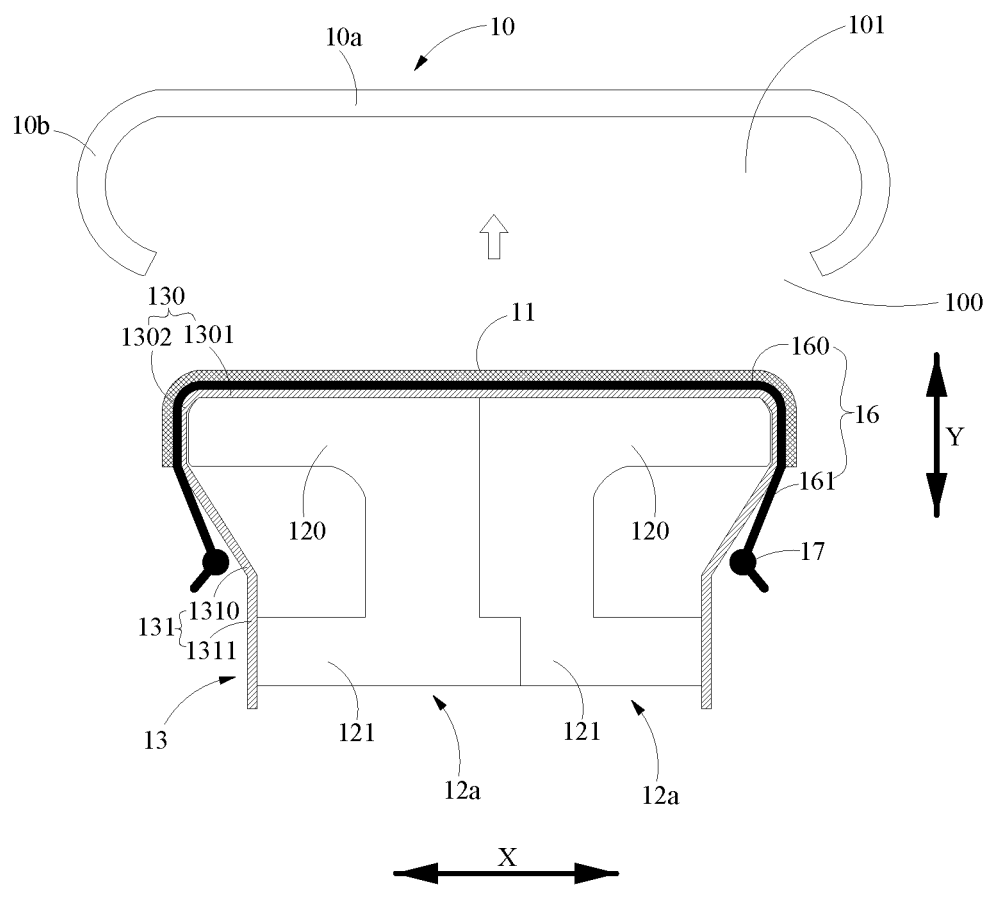
FIG. 9 to FIG. 12 are schematic diagrams showing the process of laminating the flexible panel and the curved cover plate by using the laminating device according to an embodiment of the present disclosure in different steps, respectively.
Figure 10:
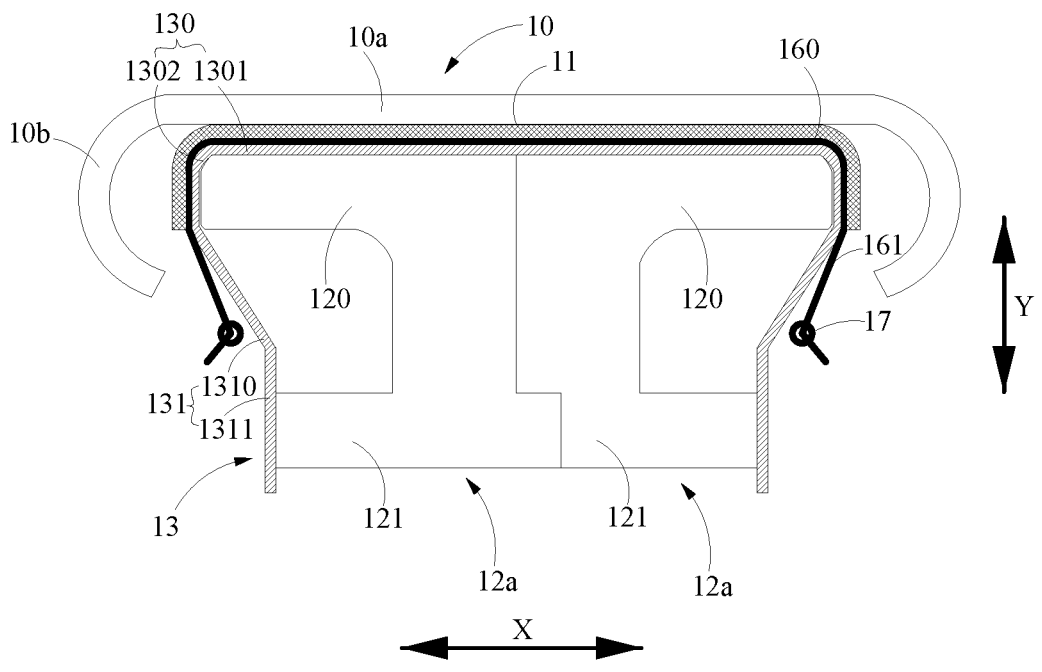
Figure 11:
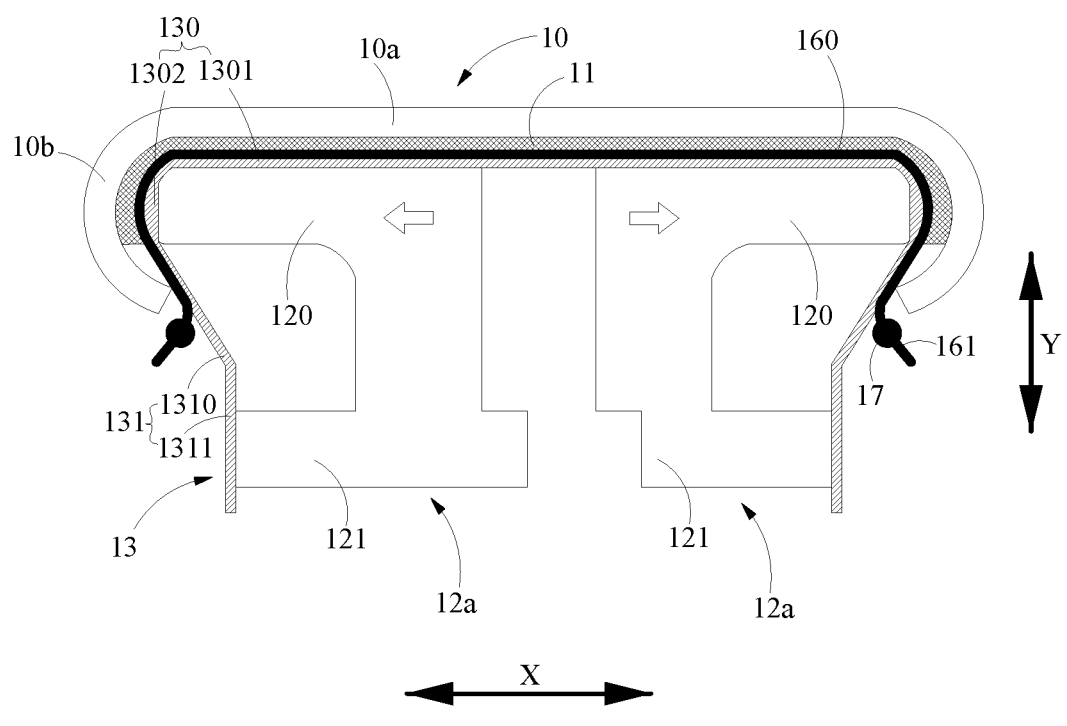

The movable mechanism in the embodiment of the present disclosure can move in a direction close to the curved cover plate 10, and the moving direction is the direction shown by the hollow arrow in FIG. 9, such that the flexible panel 11 on the elastic supporting portion 130 is located inside the curved cover plate 10, and the flexible panel 11 is laminated to the central area 10a, as shown in FIG. 10; and the first movable base table 12a and the second movable base table 12b can move in the first direction X in directions away from each other, the moving directions are the directions shown by the left and right arrows shown in FIG. 2 and FIG. 11. That is, the first movable base table 12a and the second movable base table 12b can move toward the position where the corresponding edge bending area 10b is located, so that the flexible panel 11 is laminated with the edge bending area 10b, as shown in FIG. 2 and FIG. 11.

It should be noted that, since the elastic supporting portion 130 has certain elasticity, when the first movable base table 12a and the second movable base table 12b move in the first direction X in directions away from each other, the elastic supporting portion 130 may be elastically deformed, and a pressure can be applied to the flexible panel 11 to make the flexible panel 11 laminate with the edge bending area 10b; and when the first movable base table 12a and the second movable base table 12b move in the first direction X in directions close to each other, that is, when the first movable base table 12a and the second movable base table 12b are reset, the elastic supporting portion 130 can restore elastic deformation. For example, the elastic supporting member 13 can be a silicone part, that is, it is made of a silicone material, but not limited to this, and it can also be made of other elastic materials.

Based on the above solution, when the flexible panel 11 is laminated to the curved cover plate 10 by using the above laminating device, the curved cover plate 10 can be fixed first, that is, the position of the curved cover plate 10 can be determined first, and then the movable mechanism can be arranged opposite to the curved cover plate 10, and the flexible panel 11 is fixed on the elastic supporting portion 130 of the movable mechanism, as shown in FIG. 5; then the movable mechanism may be driven to move in the direction close to the curved cover plate 10, such that the flexible panel 11 on the elastic supporting portion 130 is located inside the curved cover plate 10, and the movable mechanism can continue to be driven to move in the direction close to the central area 10a of the curved cover plate 10, to apply a pressure to the flexible panel 11, so that the flexible panel 11 is laminated to the central area 10a of the curved cover plate 10, as shown in FIGS. 9 and 10; after the flexible panel 11 is laminated to the central area 10a of the curved cover plate 10, the first movable base table 12a and the second movable base table 12b can be driven to move in directions away from each other, to apply a sufficiently large pressure to the flexible panel 11, to make the flexible panel 11 laminate with the edge bending area 10b of the curved cover plate 10, as shown in FIG. 2 or FIG. 11; such design not only can ensure the laminating tightness between the flexible panel 11 and the central area 10a of the curved cover plate 10, but also can ensure the laminating tightness between the flexible panel 11 and the edge bending area 10b of the curved cover plate 10, thereby improving the laminating uniformity, reducing lamination bubbles and improving product yield.

After the flexible panel 11 is laminated to the edge bending area 10b of the curved cover plate 10, the entire movable mechanism can also be driven to continue to move in a direction toward the center area 10a of the curved cover plate 10, so as to further ensure that the flexible panel 11 is fully laminated to the curved cover plate 10.

In this embodiment, the flexible panel 11 and the curved cover plate 10 are laminated by setting the movable mechanism, which can ensure that the pressure in the side bending area is controllable, so as to avoid generating air bubbles and gaps of cracks in the laminating process. In addition, the laminating device has a simple structure, low cost, and has a wide range of applications.

It should be noted that the flexible panel 11 mentioned in the embodiment of the present disclosure may be an OLED display panel attached with OCA optical adhesive; the curved cover plate 10 may be a glass cover plate. In addition, the embodiments of the present disclosure may further include a driving mechanism, which is connected with the movable mechanism and used to drive the movable mechanism as a whole to move in a direction close to or away from the curved cover plate 10. The driving mechanism may be a driving motor or a driving cylinder, etc.

As shown in FIGS. 5 and 9, when the second direction is the thickness direction Y of the central area 10a of the curved cover plate 10, the movable mechanism can drive the flexible panel 11 on its elastic supporting portion 130 to enter the inner side of the curved cover plate 10 from the bottom opening 100 of the curved cover plate 10, it should be noted that the bottom opening 100 is an opening formed between the ends of the edge bending areas 10b on both sides away from the central region 10a. The region located below the dotted line in the curved cover plate 10 in FIG. 5 can be understood as the bottom opening 100.

When the second direction is a direction perpendicular to both the thickness direction Y of the central area 10a of the curved cover plate 10 and the first direction X, the movable mechanism can drive the flexible panel 11 on its elastic support portion 130 to enter the inner side of the curved cover plate 10 from the side opening 101 of the curved cover plate 10. It should be noted that the side opening 101 is an opening formed between the side surfaces of the edge bending areas 10b on both sides. The region located above the dotted line in the curved cover plate 10 in FIG. 5 can be understood as the bottom opening 100. It should be understood that the dotted lines shown in FIG. 5 have no actual meaning, and they are only used to distinguish the side opening 101 and the bottom opening 100 in the curved cover plate 10, for ease of understanding.

Figure 4:
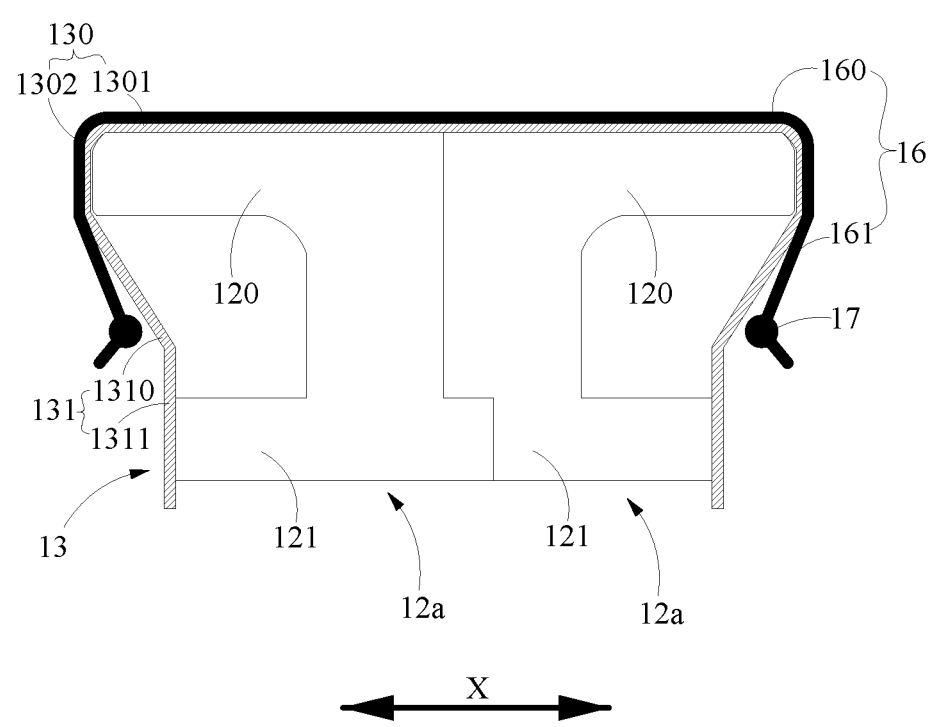
FIG. 4 shows a schematic plan view of a laminating device according to yet another embodiment of the present disclosure.

Since the size of the bottom opening 100 of the curved cover plate 10 is relatively small, in order to prevent the flexible panel 11 from contacting with the edge bending area 10b of the curved cover plate 10 in advance during the process of entering the inner side of the curved cover plate 10 from the bottom opening 100, which will leads to failure of laminating, the flexible panel 11 needs to be bent and shrunk first, so that the volume of the flexible panel 11 can be reduced to the extent that the flexible panel 11 can smoothly enter the inner side of the curved cover plate 10 from the bottom opening 100 without contacting with the curved cover plate 10 in advance. In addition, when the movable mechanism drives the flexible panel 11 on its elastic supporting portion 130 to enter from the bottom opening 100 of the curved cover plate 10 into the inner side of the curved cover plate 10, the flexible panel 11 needs to be expanded slowly when the first movable base table 12a and the second movable base table 12b move in the first direction X in directions away from each other, so that the flexible panel 11 can contact and laminate with the edge bending area 10b of the curved cover plate 10; in order to achieve In this process, in the embodiment of the present disclosure, as shown in FIGS. 4 and 5, the laminating device may further include a carrier film 16 and a clamping adjustment mechanism 17.

The carrier film 16 may include a laminating portion 160, for laminating with the flexible panel 11, and connecting portions 161 located at opposite two sides of the laminating portion 160 in the first direction X. The laminating portion 160 is supported on the elastic supporting portion 130.

The clamping adjustment mechanism 17 is connected with the connecting portion 161 and can apply a clamping force to the connecting portion 161, such that the laminating portion 160 is laminated to the elastic supporting portion 130, and the carrier film 16 and the flexible panel 11 thereon are bent and contracted, and the volume of the flexible panel 11 is reduced to the extent that the flexible panel 11 can smoothly enter the inner side of the curved cover plate 10 from the bottom opening 100 without contacting the curved cover plate 10 in advance. In addition, by bending and contracting the carrier film 16, it can also ensure that the carrier film 16 is stably supported on the elastic supporting portion 130; when the first movable base table 12a and the second movable base table 12b move in the first direction X in directions away from each other, that is, when the flexible panel is 11 is laminated to the edge bending area 10b of the curved cover plate 10, the clamping adjustment mechanism 17 can reduce the clamping force applied to the connecting portion 161, so that the carrier film 16 and the flexible panel 11 thereon are properly expanded, so that the flexible panel 11 can completely contact and closely laminate with the edge bending area 10b of the curved cover plate 10, as shown in FIG. 11, which can ensure the laminating yield.

It should be noted that, when the flexible panel 11 is in the bending and contracting state, the shape of the part corresponding to the central area 10a of the curved cover plate 10 on the flexible panel 11 is the same as the shape of the central area 10a of the curved cover plate 10, and this part first contacts with the central area 10a of the curved cover plate 10. In addition, it should be noted that, in the process of reducing the clamping force exerted on the connecting portion 161 by the clamping adjustment mechanism 17 to expand the flexible panel 11, the main purpose is to expand the side of the flexible panel 11, to ensure that the side of the flexible panel 11 completely contacts with the edge bending area 10b of the curved cover plate 10, this process will basically not affect the shape of the part of the flexible panel 11 corresponding to the central area 10a of the curved cover plate 10.

The clamping adjustment mechanism 17 can remove the clamping force exerted on the connecting portion 161, after the flexible panel 11 and the curved cover plate 10 are completely closely laminated.

In some embodiments, as shown in FIG. 4 and FIG. 5, two clamping adjustment mechanisms 17 may be provided, which are respectively connected with the connecting portions 161 at both sides of the laminating portion 160. But the disclosure is not limited to this, and one clamping adjustment mechanism 17 can also be set. For example, the clamping adjustment mechanism 17 can be a vacuum suction clamp, but it is not limited to this type of mechanism, as long as the above-mentioned purpose can be achieved.

In some embodiments, an adhesive layer (not shown in the figure) for bonding with the flexible panel 11 may be provided on the laminating portion 160, that is, the flexible panel 11 is bonded on the laminating portion 160 through the adhesive layer. For example, the laminating portion 160 can be made of a resin material, and the adhesive layer can be made of a material that loses its viscosity under UV (ultraviolet) irradiation, so that after the flexible panel 11 and the curved cover plate 10 are completely and tightly laminated, the adhesive layer is irradiated with UV to make the adhesive layer lose its viscosity, so that the carrier film 16 can be detached from the flexible panel 11.

In some embodiments, as shown in FIGS. 1 and 2, the movable mechanism further includes a first fixing slide rail 14a, a second fixing slide rail 14b, a moveable base 15 and a first driving member (not shown in the figure). Specifically, the first movable base table 12a is slidably mounted on the first fixing slide rail 14a, and the first movable base table 12a slides relative to the first fixing slide rail 14a in the first direction X; the second movable base table 12b is slidably mounted on the second fixing slide rail 14b, and the second movable base table 12b slides relative to the second fixing slide rail 14b in the first direction X; the movable base 15 has a first pushing inclined surface 150 cooperated with the first movable base table 12a and a second pushing inclined surface 151 cooperated with the second movable base table 12b; the first driving member is connected with the movable base 15, and configured to drive the movable base 15 to move in a direction close to or away from the central area 10a of the curved cover plate 10; wherein, when the first driving member drives the movable base 15 to move in a direction close to the central area 10a of the curved cover plate 10, the first pushing inclined surface 150 and the second pushing inclined surface 151 respectively push the first movable base table 12a and the second movable base table 12b to move in the first direction X in directions away from each other.

Optionally, a reset elastic member (not shown in the figure) is further provided in the first movable base table 12a and the second movable base table 12b, wherein, when the first driving member drives the movable base 15 to move in a direction close to the central area 10a of the curved cover plate 10, the first movable base table 12a and the second movable base table 12b move in the first direction X in directions away from each other, and the reset elastic member is elastically deformed; when the first driving member drives the movable base 15 to move in a direction away from the central area 10a of the curved cover plate 10, the reset elastic member restores elastic deformation, to drive the first movable base table 12a and the second movable base table 12b to move in the first direction X in directions close to each other.

It should be understood that the movable mechanism may include a frame (not shown in the figure) for fixing the first fixing slide rail 14a and the second fixing slide rail 14b. One end of the reset elastic member can be fixed on the first movable base table 12a (the second movable base table 12b), and the other end can be connected with the frame, the first fixing slide rail 14a (the second fixing slide rail 14b) and other fixing structures.

For example, the reset elastic member can be a structure such as a spring or rubber, but is not limited thereto. The reset elastic member can be arranged inside the first fixing slide rail 14a (the second fixing slide rail 14b), but is not limited to this, and it can also be arranged outside the first fixing slide rail 14a (the second fixing slide rail 14b), which depends on the specific situation.

Figure 3:
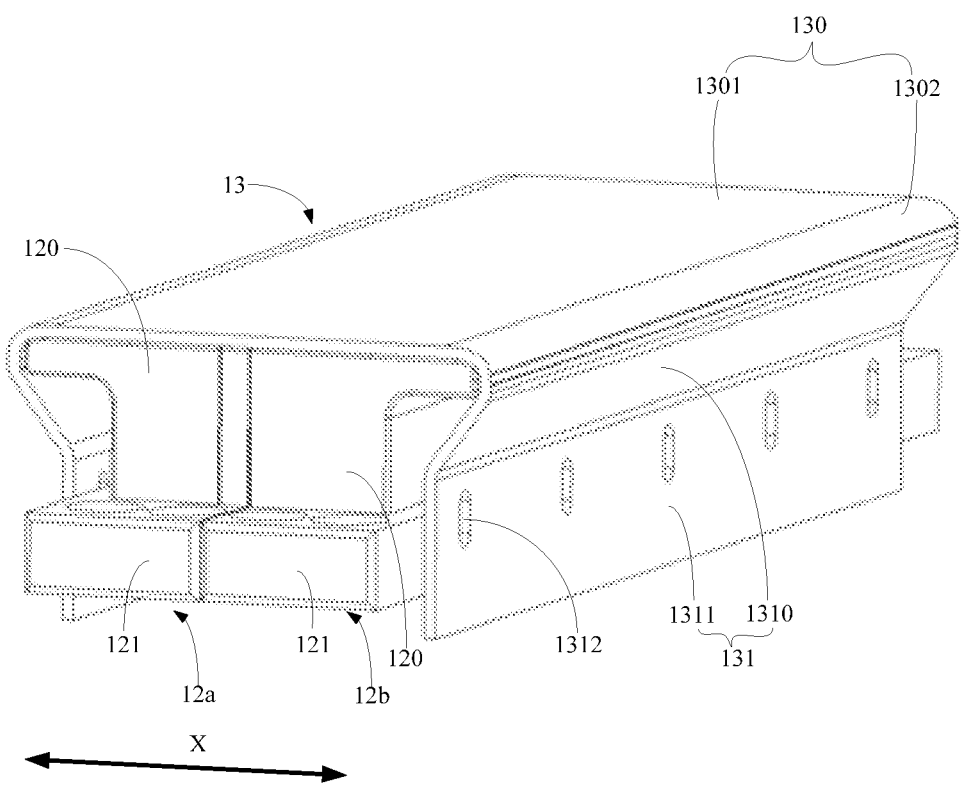
FIG. 3 shows a three-dimensional schematic diagram of a laminating device according to another embodiment of the present disclosure.

The first movable base table 12a and the second movable base table 12b in the movable mechanism are not limited to adopting the structure of the above-mentioned embodiment to realize their movement in the first direction X; in other embodiments, as shown in FIG. 3 and FIG. 4, the movable mechanism may further include a second driving member (not shown in FIG. 3 and FIG. 4) and a third driving member (not shown in FIG. 3 and FIG. 4), the second driving member is connected with the first movable base table 12a, and is used to drive the first movable base table 12a to move in the first direction X in directions close to or away from the second movable base table 12b; the third driving member is connected to the second movable base table 12b and is used to drive the second movable base table 12b to move in the first direction X in directions close to or away from the first movable base table 12a.

It should be noted that the aforementioned first driving member, second driving member, and third driving member may be structures such as driving motors or driving cylinders.

Figure 6A:
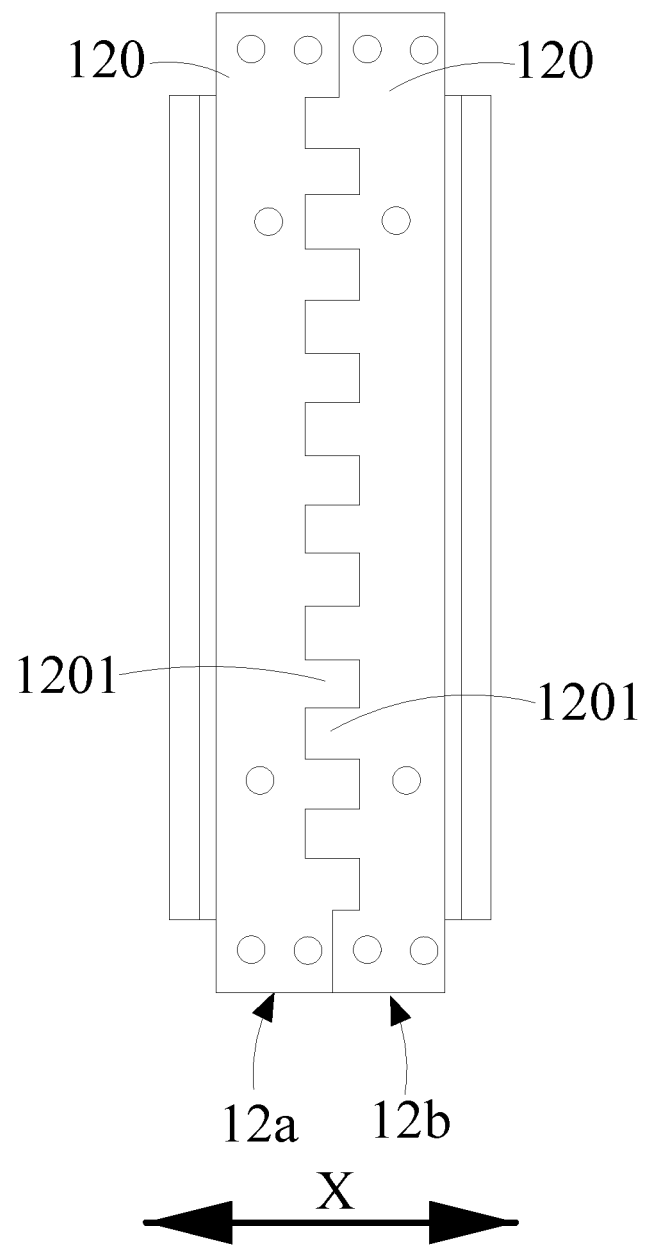
FIGS. 6a and 6b are schematic diagrams showing the positional relationship between the first movable base table and the second movable base table of the laminating device in an engaged state according to different embodiments of the present disclosure.
Figure 6B:
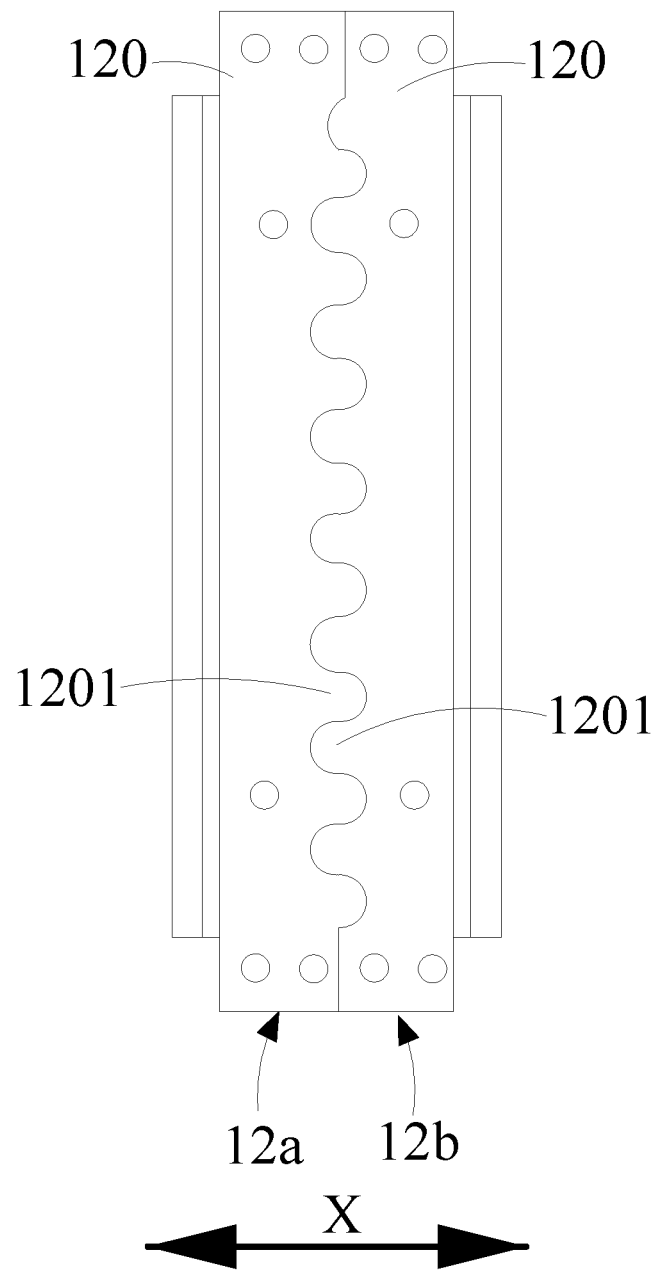
Figure 7:
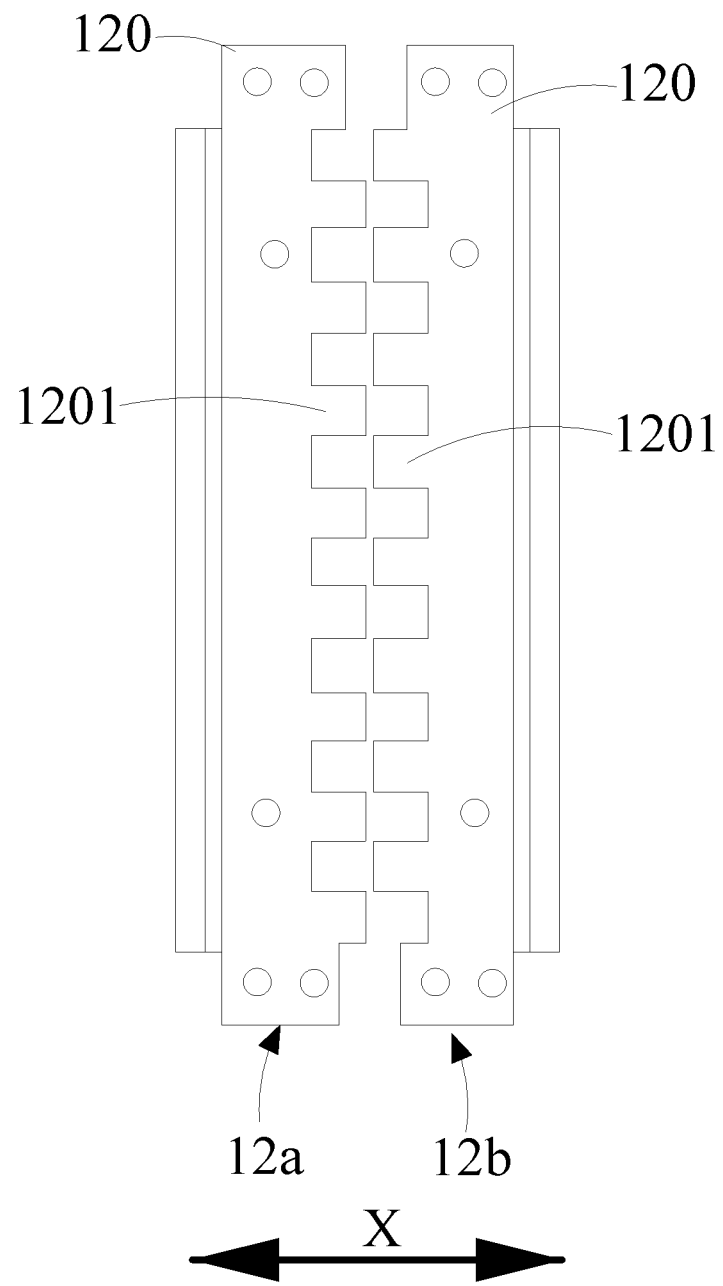
FIG. 7 shows a schematic diagram of the positional relationship between the first movable base table and the second movable base table of the laminating device described in FIG. 6a in a separated state.

In some embodiments, as shown in FIGS. 1 to 5, the first movable base table 12a and the second movable base table 12b may include a supporting table 120 covered with the elastic supporting portion 130 and a fixing table 121 located on the supporting table 120 away from the elastic supporting portion 130, as shown in FIGS. 6 and 7, surfaces of the supporting table 120 of the first movable base table 12a and the supporting table 120 of the second movable base table 12b facing each other are provided with a sawtooth structure and engage with each other, through such design, when the first movable base table 12a and the second movable base table 12b move in directions away from each other, the sawtooth structure on the first movable base table 12a and the second movable base table 12b can still play a certain supporting role on the middle portion of the elastic supporting portion 130, thereby ensuring the laminating pressure of the flexible panel 11 and the central area 10a of the curved cover plate 10 during the laminating process, thereby improving the laminating uniformity.

Optionally, as shown in FIGS. 6a, 6b and 7, the sawtooth structure is formed by splicing a plurality of tooth parts 1201 in sequence. For example, in some embodiments, as shown in FIG. 6a, the shape of the plurality of tooth parts can be a rectangle, which can ensure the area of for supporting the middle part of the elastic supporting portion 130; in other embodiments, as shown in FIG. 6b, the shape of the plurality of tooth parts can be arc-shaped, so that while ensuring the area for supporting the middle part of the elastic supporting portion 130, the impact of the tooth parts 1201 in the first movable base table 12*a* and the second movable base table 12*b* during the engagement process (that is, when moving toward each other) can also be relieved, so that the service life of the first movable base table 12*a* and the second movable base table 12*b* can be extended; or in other embodiments, the shape of the tooth parts 1201 in the sawtooth structure may include a rectangular shape and a circular arc shape, wherein the rectangular tooth part and the circular arc tooth part may be alternately arranged.

It should be understood that the tooth parts 1201 in the sawtooth structure in the implementation of the present disclosure are not limited to the above-mentioned shapes, and may also be other shapes, such as trapezoids, triangles, and the like.

In some embodiments, as shown in FIG. 3 and FIG. 4, the elastic supporting member 13 may further include a fixing portion 131 extending from two ends of the elastic supporting portion 130 to a direction close to the fixing table 121, the fixing portion 131 is connected with the fixing table 121, such that the elastic supporting member 13 is fixed on the first movable base table 12*a* and the second movable base table 12*b*.

As shown in FIG. 3 and FIG. 4, the fixing portion 131 may have a first extending section 1310 and a second extending section 1311, one end of the first extending section 1310 is connected with the second extending section 1311, and the other end of the first extending section 1310 is inclined in a direction away from a center of the elastic supporting portion 130 and is connected with the end of the elastic supporting portion 130; the second extending section 1311 is provided with a fixing hole 1312, and the fixing hole 1312 is used for one end of a locking piece to pass through and connected with the fixing table 121, to ensure the connection stability between the elastic supporting member 13 and the first movable base table 12*a* and the second movable base table 12*b*.

For example, the elastic supporting member 13, the first movable base table 12*a*, the second movable base table 12*b*, and the carrier film 16 mentioned in the embodiments of the present disclosure may be an integrated structure, to ensure the structural strength.

It should be noted that the laminating device may further include a jig for fixing the curved cover plate 10, and the jig may be disposed opposite to the movable mechanism in the second direction. For example, the jig can be a vacuum suction mechanism, but it is not limited to this, and can also be other fixing mechanisms.

Figure 8:
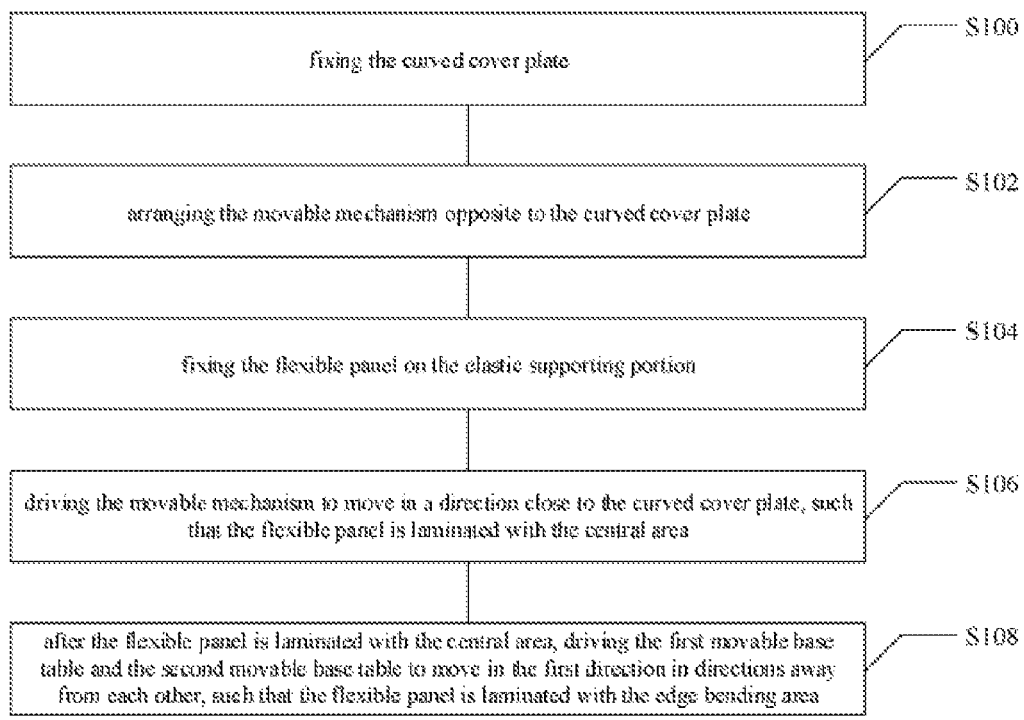
FIG. 8 shows a flowchart of the laminating method according to an embodiment of the present disclosure.

An embodiment of the present disclosure also provides a laminating method, for laminating a flexible panel 11 and a curved cover plate 10, wherein the laminating method may adopt the laminating device according to any one of the above embodiments. For the specific structure of the laminating device, reference may be made to the structure described in the foregoing relevant description, which will not be repeated herein. As shown in FIG. 8, the laminating method includes:

S100, fixing the curved cover plate 10;

S102, arranging the movable mechanism opposite to the curved cover plate 10;

S104, fixing the flexible panel 11 on the elastic supporting portion 130;

S106, driving the movable mechanism to move in a direction close to the curved cover plate 10, such that the flexible panel 11 is laminated with the central area 10*a*, as shown in FIGS. 9 and 10;

S108, after the flexible panel 11 is laminated with the central area 10*a*, driving the first movable base table 12*a* and the second movable base table 12*b* to move in the first direction X in directions away from each other, such that the flexible panel 11 is laminated with the edge bending area 10*b*, as shown in FIG. 11.

In the embodiment of the present disclosure, the flexible panel 11 on the elastic supporting portion 130 is located at the inner side of the curved cover plate 10 by driving the movable mechanism to move toward the direction close to the curved cover plate 10, and then the entire movable mechanism can be continuously driven to move toward the direction close to the central area 10*a* of the curved cover plate 10, to apply a pressure to the flexible panel 11, so that the flexible panel 11 is laminated to the central area 10*a* of the curved cover plate 10, and after the flexible panel 11 is laminated to the central area 10*a* of the curved cover plate 10, the first movable base table 12*a* and the second movable base table 12*b* can be driven to move in directions away from each other, to apply a pressure to the flexible panel 11, so that the flexible panel 11 is laminated to the edge bending area 10*b* of the curved cover plate 10. Such design not only can ensure the laminating tightness between the flexible panel 11 and the central area 10*a* of the curved cover plate 10, but also can ensure the laminating tightness between the flexible panel 11 and the edge bending area 10*b* of the curved cover plate 10, thereby improving the laminating uniformity, reducing lamination bubbles, and improving product yield.

It should be noted that although the various steps of the methods of the present disclosure are depicted in the figures in a particular order, this does not require or imply that the steps must be performed in that particular order, or that all illustrated steps must be performed to achieve the desired result. Additionally or alternatively, certain steps may be omitted, multiple steps may be combined into one step for execution, and/or one step may be decomposed into multiple steps for execution, and the like. Furthermore, some of the above steps may be performed in parallel or sequentially, etc., and are not limited to the specific order of operations described above.

In some embodiments, in the laminating method, when the first movable base table 12*a* and the second movable base table 12*b* are driven to move in directions away from each other in the first direction X, the clamping force exerted on the connecting portion 161 can be reduced through the clamping adjustment mechanism 17.

In a specific embodiment, the laminating method may include following steps.

S200, the flexible panel 11 is laminated to the laminating portion 160 of the carrier film 16 and placed on the elastic supporting portion 130 of the elastic supporting member 13, and then a clamping force is applied to the connection portion 161 of the carrier film 16 through the clamping adjustment mechanism 17, to realize pre-bending; as shown in FIG. 5, the movable mechanism moves up to 1 mm inside the curved cover plate 10, and the carrier film 16 needs to be bound in place, to prevent the movable mechanism from contacting the curved cover plate 10 in advance during the upward movement, which results in failure of the laminating.

S202, the movable mechanism moves up slowly, as shown in FIG. 9, such that the flexible panel 11 contacts the inner side of the central area 10*a* of the curved cover plate 10, as shown in FIG. 10, at this time, the states of the carrier film 16, the flexible panel 11 and the clamping adjustment mechanism 17 are the same as those of S200, to ensure that the flexible panel 11 is in a pre-tightened state, to prevent the flexible panel 11 from being up-warped.

S204, the first movable base table 12a and the second movable base table 12b are driven to move in directions away from each other in the first direction X, as shown in FIG. 11, a sufficient laminating pressure is applied to the flexible panel 11 and the edge bending area 10b of the curved cover panel 10; at this time, the clamping adjustment mechanism 17 is adjusted accordingly, that is, the clamping force exerted on the connecting portion 161 is reduced; after the flexible panel 11 and the edge bending area 10b of the curved cover plate 10 are laminated, an overall upward force is applied to the movable mechanism, such that the flexible panel 11 and the curved cover plate 10 are fully laminated, and then, the clamping adjustment mechanism 17 removes the clamping force.

Figure 12:
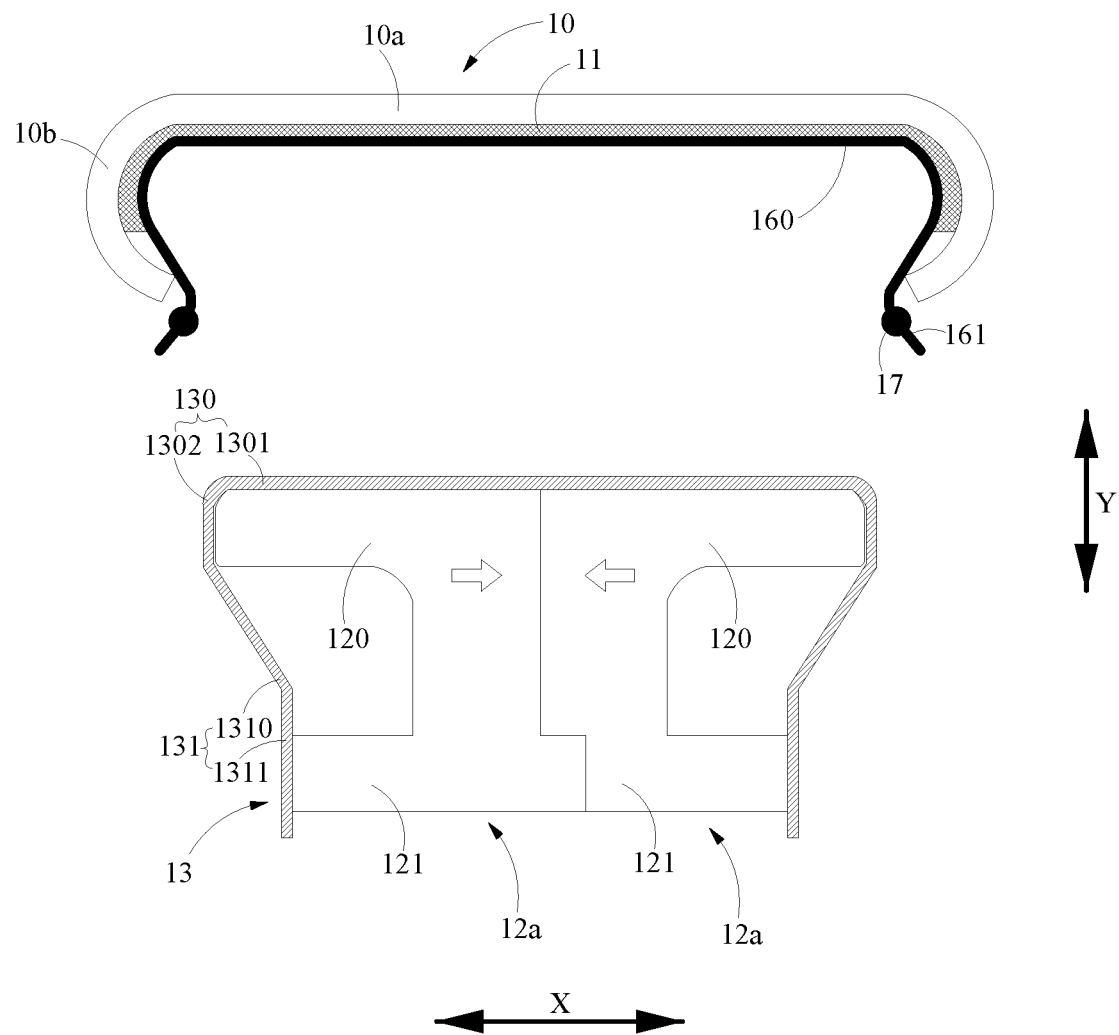

S206, after the lamination is completed, the first movable base table 12a and the second movable base table 12b are driven to move in directions close to each other, that is, resetting; and then the entire movable mechanism is driven to move down to the initial position, as shown in FIG. 12, to complete the entire lamination process.

Those skilled in the art will easily think of other embodiments of the present disclosure after considering the specification and practicing the disclosure disclosed herein. This disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are indicated by the appended claims.

What is claimed is:

1. A laminating device for laminating a flexible panel and a curved cover plate, wherein the curved cover plate has a central area and an edge bending area located in a first direction of the central area, comprising:
    a movable mechanism, wherein the movable mechanism is arranged opposite the curved cover plate in a second direction and comprises:
        a first movable base table;
        a second movable base table arranged opposite the first movable base table in the first direction; and
        an elastic supporting member having an elastic supporting portion, wherein the elastic supporting portion covers on parts of the first movable base table and the second movable base table that are close to the curved cover plate, and is used for fixing the flexible panel, wherein:
        the movable mechanism is adapted to move in a direction close to the curved cover plate, such that the flexible panel is laminated to the central area; and
        the first movable base table and the second movable base table are adapted to move in the first direction in directions away from each other, such that the flexible panel is laminated to the edge bending area;
    a carrier film comprising a laminating portion for laminating with the flexible panel and connecting portions located at opposite two sides of the laminating portion in the first direction, the laminating portion being supported on the elastic supporting portion; and
    a clamping adjustment mechanism connected with the connecting portion and adapted to apply a clamping force to the connecting portion, such that the laminating portion is laminated to the elastic supporting portion;
    wherein, when the first movable base table and the second movable base table move in the first direction in directions away from each other, the clamping adjustment mechanism is adapted to reduce the clamping force applied to the connecting portion,
    wherein an adhesive layer for adhering to the flexible panel is provided on the laminating portion, and
    wherein the first movable base table and the second movable base table comprise a supporting table covered with the elastic supporting portion and a fixing table located on the supporting table away from the elastic supporting portion, surfaces of the supporting table of the first movable base table and the supporting table of the second movable base table facing each other are provided with a sawtooth structure and engage with each other.

2. The laminating device according to claim 1, wherein the movable mechanism further comprises:
    a first fixing slide rail, wherein the first movable base table is slidably mounted on the first fixing slide rail, and the first movable base table slides relative to the first fixing slide rail in the first direction;
    a second fixing slide rail, wherein the second movable base table is slidably mounted on the second fixing slide rail, and the second movable base table slides relative to the second fixing slide rail in the first direction;
    a movable base, having a first pushing inclined surface cooperated with the first movable base table and a second pushing inclined surface cooperated with the second movable base table;
    a first driving member, connected with the movable base, and configured to drive the movable base to move in a direction close to or away from the central area of the curved cover plate;
    wherein, when the first driving member drives the movable base to move in a direction close to the central area of the curved cover plate, the first pushing inclined surface and the second pushing inclined surface respectively push the first movable base table and the second movable base table to move in the first direction in directions away from each other.

3. The laminating device according to claim 2, wherein a reset elastic member is further provided in the first movable base table and the second movable base table, wherein,
    when the first driving member drives the movable base to move in a direction close to the central area of the curved cover plate, the first movable base table and the second movable base table move in the first direction in directions away from each other, and the reset elastic member is elastically deformed;
    when the first driving member drives the movable base to move in a direction away from the central area of the curved cover plate, the reset elastic member restores elastic deformation, to drive the first movable base table and the second movable base table to move in the first direction in directions close to each other.

4. The laminating device according to claim 3, wherein:
    the elastic supporting member further comprises a fixing portion extending from two ends of the elastic supporting portion to a direction close to the fixing table, the fixing portion is connected with the fixing table, such that the elastic supporting member is fixed on the first movable base table and the second movable base table.

5. The laminating device according to claim 3, wherein the elastic supporting member is a silicone member.

6. The laminating device according to claim 2, wherein:
the elastic supporting member further comprises a fixing portion extending from two ends of the elastic supporting portion to a direction close to the fixing table, the fixing portion is connected with the fixing table, such that the elastic supporting member is fixed on the first movable base table and the second movable base table.

7. The laminating device according to claim 2, wherein the elastic supporting member is a silicone member.

8. The laminating device of claim 1, wherein the movable mechanism further comprises:
a second driving member connected to the first movable base table, and configured to drive the first movable base table to move in the first direction in directions close to or away from the second movable base table; and
a third driving member connected to the second movable base table, and configured to drive the second movable base table to move in the first direction in directions close to or away from the first movable base table.

9. The laminating device according to claim 8, wherein:
the elastic supporting member further comprises a fixing portion extending from two ends of the elastic supporting portion to a direction close to the fixing table, the fixing portion is connected with the fixing table, such that the elastic supporting member is fixed on the first movable base table and the second movable base table.

10. The laminating device according to claim 8, wherein the elastic supporting member is a silicone member.

11. The laminating device according to claim 1, wherein:
the elastic supporting member further comprises a fixing portion extending from two ends of the elastic supporting portion to a direction close to the fixing table, the fixing portion is connected with the fixing table, such that the elastic supporting member is fixed on the first movable base table and the second movable base table.

12. The laminating device according to claim 11, wherein the sawtooth structure is formed by splicing a plurality of tooth parts in sequence, and shapes of the plurality of tooth parts are at least one of a rectangle and a circular arc.

13. The laminating device according to claim 11, wherein:
the fixing portion has a first extending section and a second extending section;
one end of the first extending section is connected with the second extending section, and the other end of the first extending section is inclined in a direction away from a center of the elastic supporting portion and is connected with the end of the elastic supporting portion; and
the second extending section is provided with a fixing hole, and the fixing hole is used for one end of a locking piece to pass through and connected with the fixing table.

14. The laminating device according to claim 11, wherein the elastic supporting member is a silicone member.

15. The laminating device according to claim 1, wherein:
the central area of the curved cover plate is a flat area; the elastic supporting portion has a flat portion and edge bending portions located at opposite two sides of the flat portion in the first direction;
the flat portion is used for applying a pressure to the flexible panel, such that the flexible panel is laminated with the central area of the curved cover plate; and
the edge bending portion is used for applying a pressure to the flexible panel, such that the flexible panel is laminated to the edge bending area of the curved cover plate.

16. The laminating device according to claim 1, wherein the elastic supporting member is a silicone member.

17. A laminating method for laminating a flexible panel and a curved cover plate, comprising:
providing the flexible panel and the curved cover plate, wherein the curved cover plate has a central area and an edge bending area located in a first direction of the central area;
providing a laminating device, wherein the laminating device comprises a movable mechanism, the movable mechanism is arranged opposite the curved cover plate in a second direction and comprises: a first movable base table; a second movable base table arranged opposite the first movable base table in the first direction; an elastic supporting member having an elastic supporting portion, wherein the elastic supporting portion covers on parts of the first movable base table and the second movable base table that are close to the curved cover plate, and is used for fixing the flexible panel, wherein the movable mechanism is adapted to move in a direction close to the curved cover plate such that the flexible panel is laminated to the central area; the first movable base table and the second movable base table are adapted to move in the first direction in directions away from each other such that the flexible panel is laminated to the edge bending area;
fixing the curved cover plate;
arranging the movable mechanism opposite to the curved cover plate;
fixing the flexible panel on the elastic supporting portion;
driving the movable mechanism to move in a direction close to the curved cover plate, such that the flexible panel is laminated with the central area; and
after the flexible panel is laminated with the central area, driving the first movable base table and the second movable base table to move in the first direction in directions away from each other such that the flexible panel is laminated with the edge bending area,
wherein, when applied to the laminating device, the laminating device further comprises a carrier film and a clamping adjustment mechanism, the carrier film comprising a laminating portion for laminating with the flexible panel and connecting portions located at opposite two sides of the laminating portion in the first direction, and the laminating portion being supported on the elastic supporting portion, and an adhesive layer for adhering to the flexible panel is provided on the laminating portion;
wherein the clamping adjustment mechanism is connected with the connecting portion and adapted to apply a clamping force to the connecting portion, such that the laminating portion is laminated to the elastic supporting portion;
wherein, when the first movable base table and the second movable base table move in the first direction in directions away from each other, the clamping adjustment mechanism is adapted to reduce the clamping force applied to the connecting portion and, when the first movable base table and the second movable base table are driven to move in the first direction in directions away from each other, a clamping force applied on the connecting portion is reduced by the clamping adjustment mechanism, wherein the first movable base table and the second movable base table comprise a supporting table covered with the elastic supporting portion and a fixing table located on the supporting table away from the elastic supporting portion, surfaces of the supporting table of the first movable base table and the supporting table of the second movable base table facing each other are provided with a sawtooth structure and engage with each other.

* * * * *